(12) United States Patent
Aromin et al.

(10) Patent No.: US 10,132,410 B2
(45) Date of Patent: Nov. 20, 2018

(54) SEALING ASSEMBLY FOR MATING AN ELECTRICAL DEVICE ENCLOSURE

(71) Applicants: Victor V Aromin, West Warwick, RI (US); Dan R Paquette, Woonsocket, RI (US)

(72) Inventors: Victor V Aromin, West Warwick, RI (US); Dan R Paquette, Woonsocket, RI (US)

(73) Assignee: TOWER MFG CORP, Providence, RI (US)

(*) Notice: Subject to any disclaimer, the term of this patent is extended or adjusted under 35 U.S.C. 154(b) by 0 days.

(21) Appl. No.: 15/459,487

(22) Filed: Mar. 15, 2017

(65) Prior Publication Data

US 2017/0276247 A1    Sep. 28, 2017

Related U.S. Application Data

(60) Provisional application No. 62/390,206, filed on Mar. 22, 2016.

(51) Int. Cl.
| | |
|---|---|
| *F16J 15/04* | (2006.01) |
| *F16J 15/06* | (2006.01) |
| *H05K 5/06* | (2006.01) |
| *H01H 83/14* | (2006.01) |

(52) U.S. Cl.
CPC ............ *F16J 15/04* (2013.01); *F16J 15/062* (2013.01); *H01H 83/14* (2013.01); *H05K 5/061* (2013.01)

(58) Field of Classification Search
CPC .. F16J 15/00; F16J 15/12; F16J 15/04; H05K 5/061; H01H 83/14
See application file for complete search history.

(56) References Cited

U.S. PATENT DOCUMENTS

| | | | | | |
|---|---|---|---|---|---|
| 4,112,283 | A | * | 9/1978 | Lathrop | F02P 7/04 116/200 |
| 4,298,204 | A | * | 11/1981 | Jinkins | F16J 15/062 220/378 |
| 5,550,324 | A | * | 8/1996 | Black | H05K 5/0008 174/564 |
| 5,957,464 | A | * | 9/1999 | Elliott | F16J 15/062 277/608 |

(Continued)

*Primary Examiner* — Gilbert Y Lee

(57) ABSTRACT

A sealing assembly for mating two sections of an electrical device enclosure is disclosed. The enclosure includes a top and bottom joinable section. The sealing assembly includes a first sealing section disposed on the top joinable section that has both first and second upper projecting lip extensions. The second upper projecting lip extension has a height less than the first upper projecting lip extension and forms a channel therebetween. A second sealing section is disposed on the bottom joinable section, and includes a downward projecting lip extension and channel. The downward projecting lip extension is offset from the first section first upward projecting lip extension when the top and bottom joinable sections are joined. At that point the downward projecting lip extension engages within the channel of the first sealing section, and the second upper projecting lip extension of said first sealing section is engaged within the second sealing section channel. The second sealing section channel can include a compressible gasket for waterproofing.

16 Claims, 7 Drawing Sheets

(56) References Cited

U.S. PATENT DOCUMENTS

| | | | | |
|---|---|---|---|---|
| 8,531,834 B2* | 9/2013 | Rayner | ............... | H01H 13/06 |
| | | | | 277/644 |
| 9,248,944 B2* | 2/2016 | Miyagawa | ............ | F16J 15/024 |
| 2013/0292383 A1* | 11/2013 | Mullaney | ............... | B65D 53/06 |
| | | | | 220/378 |

* cited by examiner

SEALING ASSEMBLY FOR MATING AN ELECTRICAL DEVICE ENCLOSURE

CROSS-REFERENCE TO RELATED APPLICATIONS

The present application is related to, claims the earliest available effective filing date(s) from (e.g., claims earliest available priority dates for other than provisional patent applications; claims benefits under 35 USC § 119 (e) for provisional patent applications), and incorporates by reference in its entirety all subject matter of the following listed application(s) (the "Related Applications") to the extent such subject matter is not inconsistent herewith; the present application also claims the earliest available effective filing date(s) from, and also incorporates by reference in its entirety all subject matter of any and all parent, grandparent, great-grandparent, etc. applications of the Related Application(s) to the extent such subject matter is not inconsistent herewith:

U.S. provisional patent application 62/390,206, entitled "Sealing Assembly For Mating an Electrical Device Enclosure", naming Victor V. Aromin as inventor, filed 22 Mar. 2016.

FIELD OF THE INVENTION

This invention relates to waterproof sealing of enclosures for electrical devices.

BACKGROUND

Electrical equipment such as transformers, relays, GFCIs, etc. which may used outdoors, or may be used in an environment that has a risk of water contact, must be protected. This is not only to prevent them from shorting out, for example when it rains, but also to increase their life which would otherwise by shortened by constant exposure to the elements, ultraviolet and solar radiation, and so forth. Accordingly, there have long been protective enclosures in which this type of equipment has been housed. And, the enclosures must be accessed for service, repair, or replacement of the equipment.

To protect the insides from moisture, enclosures utilize sealing gaskets for effecting a watertight or moisture proof seal of the enclosure. The utilization of tongue and groove type arrangements for mating sections of a device enclosure are utilized to create paths for water to travel without ultimately affecting the interior electrical devices. The present invention provides a more sophisticated "tongue and Groove" arrangement in combination with modern gasket materials that impede the influx of water and moisture even in the most severe environments.

BRIEF DESCRIPTION OF THE DRAWINGS

The foregoing and other objects, features, and advantages of the invention are apparent from the following detailed description taken in conjunction with the accompanying drawings in which.

DETAILED DESCRIPTION

Figure 1:
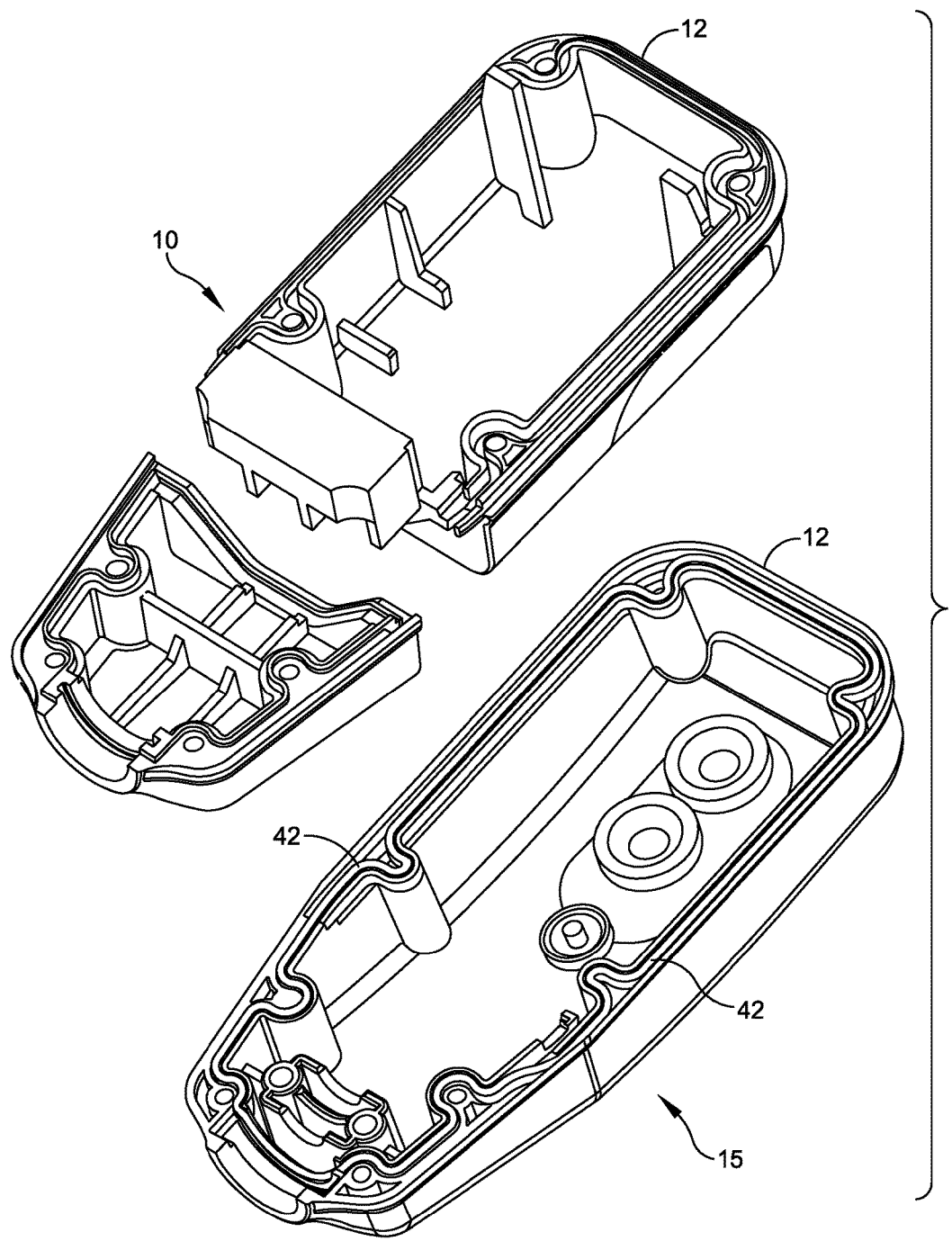
FIG. 1 is a perspective view of a sealing gasket arrangement for a GFCI enclosure.
Figure 2:
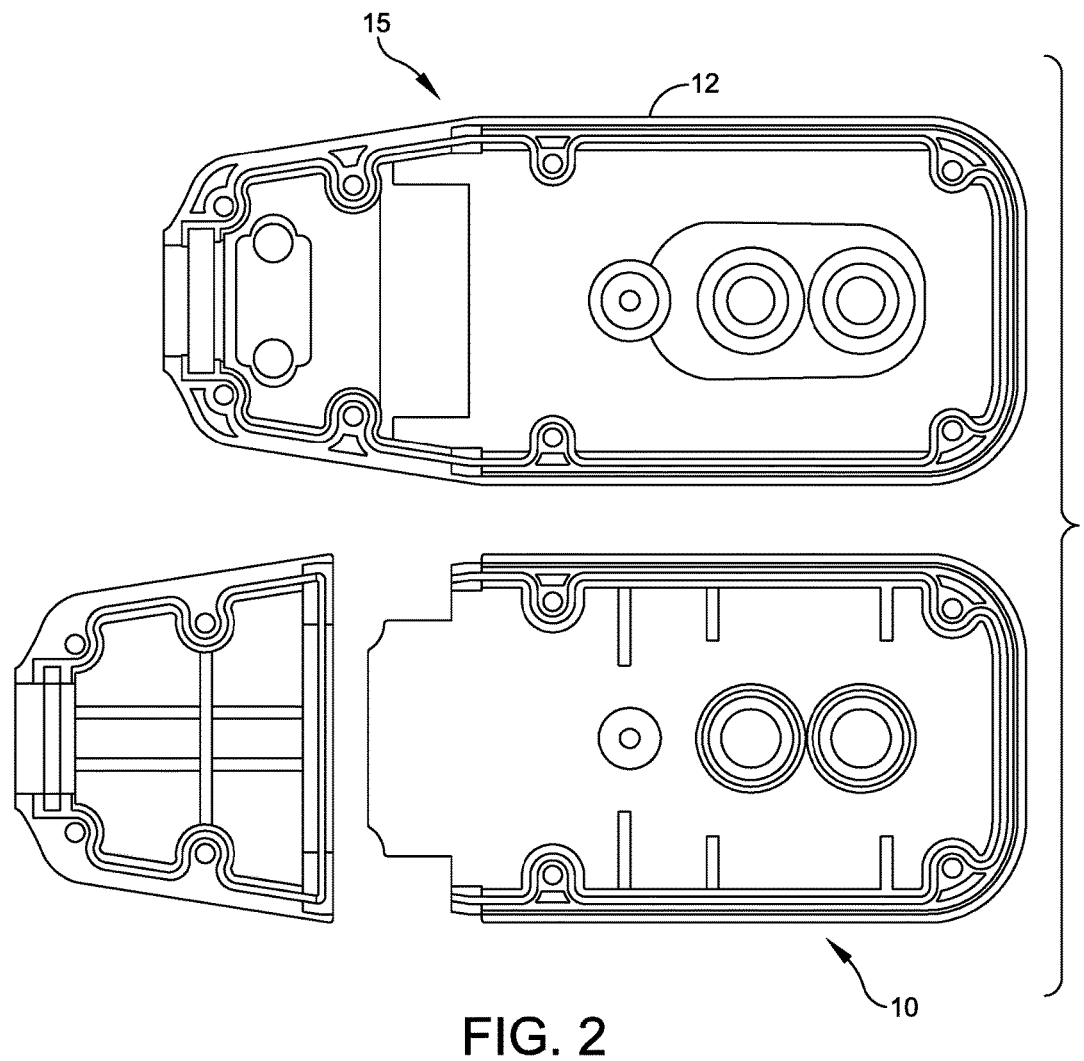
FIG. 2 is top view of FIG. 1.
Figure 3:
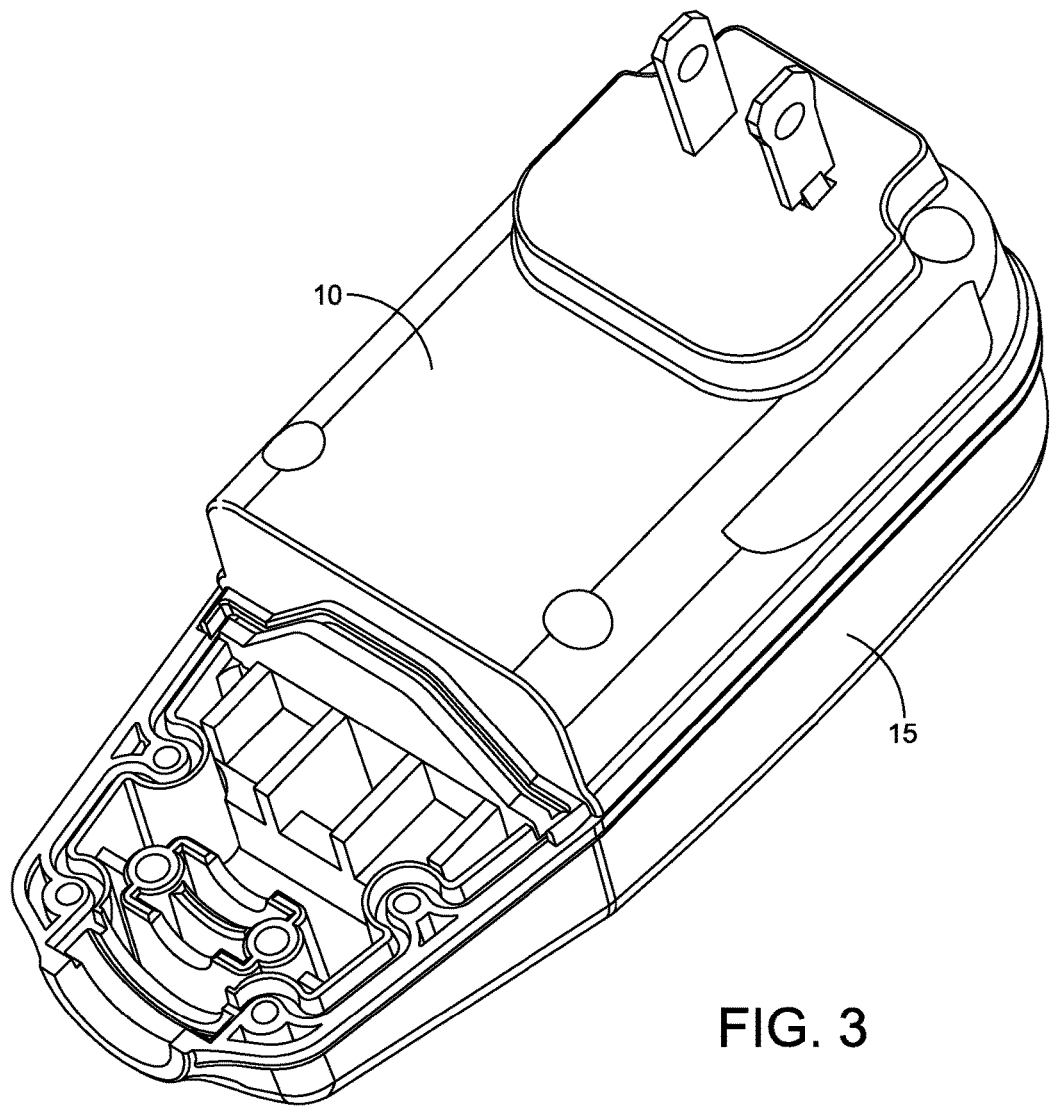
FIG. 3 is a perspective view of the sealing gasket arrangement for a GFCI enclosure partially assembled.

Referring to FIG. 1, is illustrated a sealing assembly implemented in an enclosure for a Ground Fault Circuit Interrupter (GFCI). However, the sealing assembly of the present invention can be applied to any structure suitable for housing an electrical device, or structure for sealing against moisture and the elements. Although, in the preferred embodiment illustrated herein, the sealing assembly, or arrangement is illustrated as implemented along the periphery of the enclosure sections, the assembly may be implemented in any arrangement/position to facilitate the mating of two sections.

Figure 4:
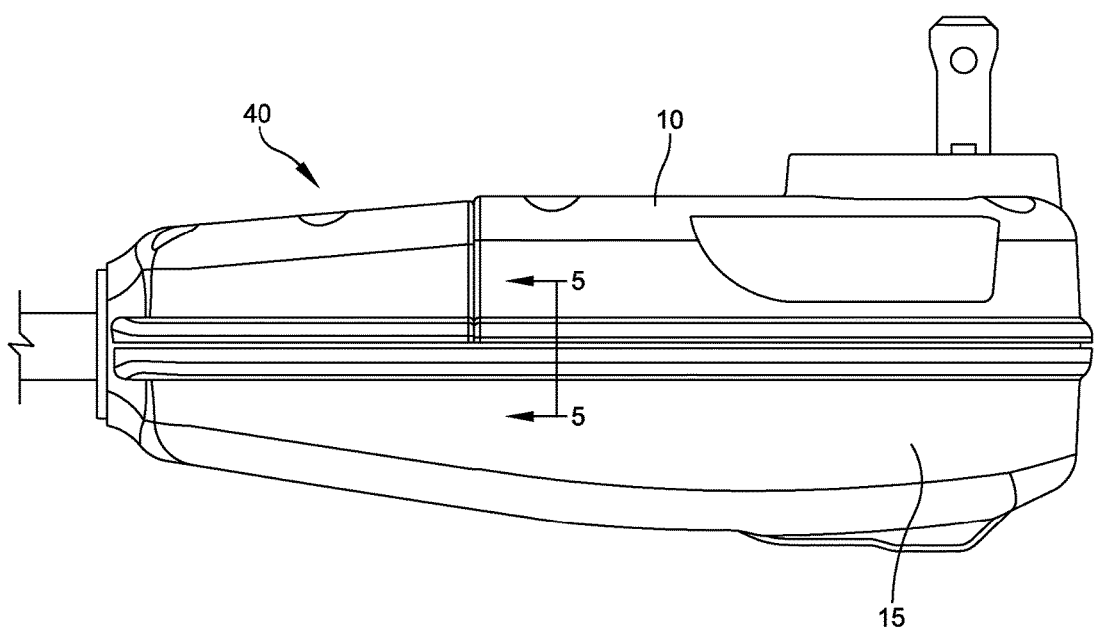
FIG. 4 is a side view of the assembled GFCI enclosure of FIG. 1.
Figure 5:
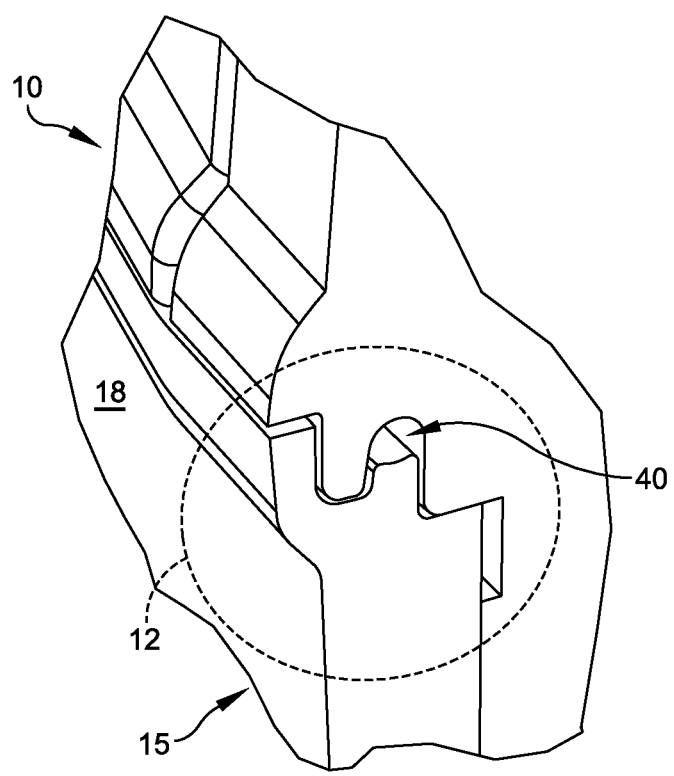
FIG. 5 is a cross sectional view of the sealing assembly of the present invention as implemented in the GFCI enclosure of FIG. 1.
Figure 6:
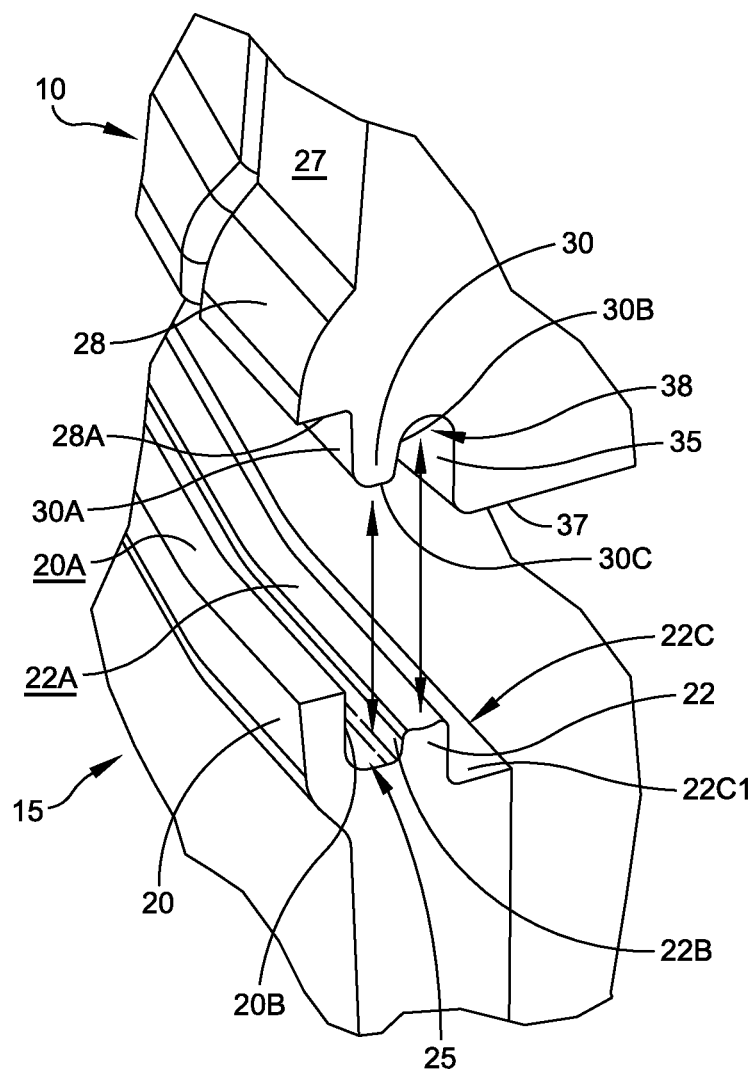
FIG. 6 is an exploded view of FIG. 5.

Sealing assembly 12 is integrated in the periphery of both the top cover 15 and bottom cover 10 of the GFCI enclosure 40 of FIG. 4. Referring to FIGS. 1, 5 and 6, the sealing mechanism 12 in this example is for mating the top 15 and bottom 10 covers of an electrical enclosure, the electrical enclosure illustrated as being GFCI enclosure 40. Referring to FIGS. 5 and 6, top cover 15 includes a sidewall 18 having a first upper projecting lip 20 including a top surface 20A and interior side surface 20B. A second upper lip projection 22 formed interior to sidewall 18 includes a top surface 22A and side surfaces 22B and 22C. First upper projecting lip 20 top surface 20A extends higher than second upper lip projection 22 top surface 22A. First upper projecting lip 20 interior side surface 20B opposes second upper lip projection 22 first side surface 22B forming a channel 25 therebetween. Second side surface 22C of second upper lip projection 22 extends downward to a orthogonal base 22C1 that sits lower than the base of channel 25.

Referring to FIG. 6, bottom cover 10 includes a sidewall 27 having a first downward projecting lip 28. The downward projecting lip 28 includes a bottom surface 28A that projects inward from sidewall 27 to a first downward lip extension 30 to form an edge recess. Downward lip extension 30 includes opposing side surfaces 30A and 30B and a top surface 30C. The edge recess is formed by bottom surface 28A and side surface 30A. Side surface 30B is opposite a third opposing side surface 35 extending to an orthogonal extension surface 37, which forms a downward projecting lip. Side surface 30B and opposing side surface 35 form a channel 38 therein. Orthogonal extension surface 37, forming a downward projecting lip, extends beyond top surface 30C, of downward lip extension 30, which extends beyond bottom surface 28A.

As illustrated in FIGS. 5 and 6, when top 15 and bottom covers 10 are mated lip extension 20 top surface 20A is in substantial alignment with bottom surface 28A, and downward lip extension 30 is received in channel 25. Also, channel 38 receives upper lip projection 22, and orthogonal lip extension surface 37 of bottom cover 10 is in substantial alignment with orthogonal base 22C1 of top cover 15. Upper lip extension 22 rests below the top surface of channel 38 to leave an opening 40 for the placement of a sealing gasket 42 therein (See FIG. 7). Top surface 22A of upper lip projection 22 may include a curved seating surface to seat sealing gasket 42. Furthermore, channel 38 may include a rounded top surface for better sealing and compression of a gasket 42 located within opening 40.

Figure 7:
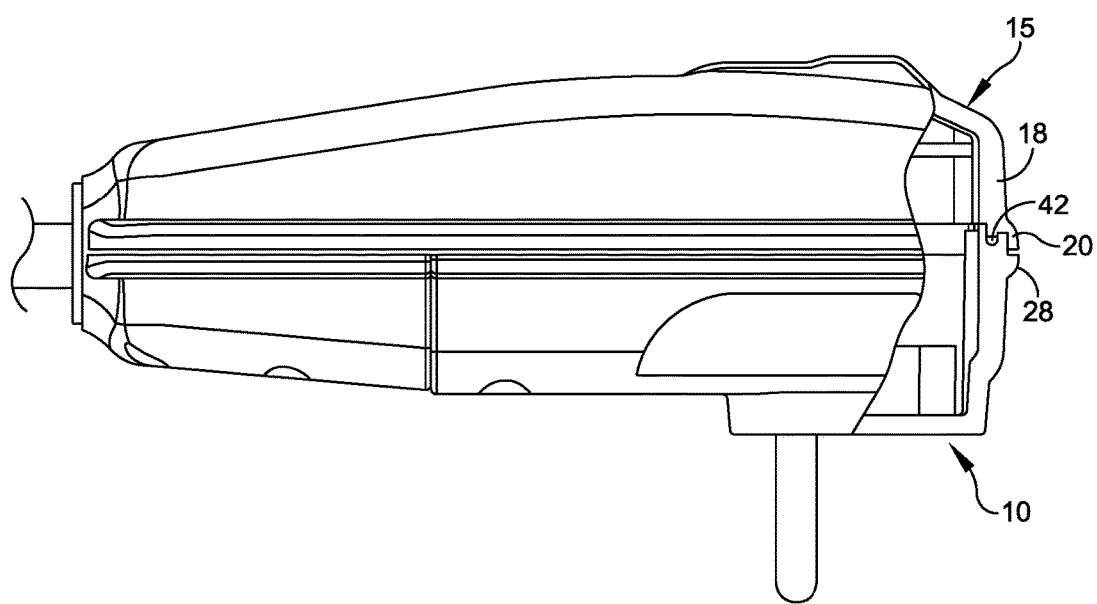
FIG. 7 is a partial cross sectional view of the sealing assembly of FIG. 4.

Referring to FIGS. 5 and 7, the mated enclosure would include a compressible gasket 42 (See FIG. 1/FIG. 7) in opening 40 that would be sized appropriately to compress within the opening 40. The gasket is utilized for the prevention of moisture and seepage within the enclosure. The sealing arrangement provides a path for seepage/moisture even before the seepage/moisture reaches the interior of the sealing assembly at the gasket point. The compressible gasket can be made from molded silicone or similar materials that are less degradable over time. By not exposing the gasket 42, UL regulations allow for limitless choices for gasket materials.

It should be understood that the foregoing description is only illustrative of the invention. Thus, various alternatives and modifications can be devised by those skilled in the art without departing from the invention. Accordingly, the present invention is intended to embrace all such alternatives, modifications and variances that fall within the scope of the appended claims.

We claim:

1. A sealing assembly for mating an electrical device enclosure, the enclosure having top and bottom joinable sections, the assembly comprising:
    a first sealing section disposed on said top joinable section, said first sealing section including first and second upper projecting lip extensions, the second upper projecting lip extension having a height less than the first upper projecting lip extension, the first and second upper projecting lip extensions of said first sealing section forming a channel therebetween;
    a second sealing section disposed on said bottom joinable section, said second sealing section comprising a downward projecting lip extension, said downward projecting lip extension offset from said first section upward projecting lip extension when said top and bottom joinable sections are joined, said downward projecting lip extension engaged within said channel of said first sealing section, said second sealing section further including a channel adjacent to said first downward projecting lip extension, said second upper projecting lip extension of said first sealing section engaged within said second sealing section channel.

2. A sealing assembly for mating an electrical device enclosure, as in claim 1, wherein said second upper projecting lip extension of said first sealing section is partially engaged in said second sealing section channel, defining an opening therein.

3. A sealing assembly for mating an electrical device enclosure, as in claim 2, wherein said opening in said second sealing section channel further includes a gasket therein.

4. A sealing assembly for mating an electrical device enclosure, as in claim 3, wherein said first sealing section second upper projecting lip top surface further includes a curved seating surface, said gasket positioned on said seating surface.

5. A sealing assembly for mating an electrical device enclosure, as in claim 3, wherein said gasket is sized to compress when said top and bottom joinable sections are joined.

6. A sealing assembly for mating an electrical device enclosure, as in claim 1,
    wherein said second sealing section downward projecting lip extension further includes first and second side surfaces, and wherein said second sealing section further includes a recessed edge having a bottom surface orthogonal to said downward projecting lip extension first side surface, and
    wherein said first sealing section first upper projecting lip extension further includes a top surface and a side surface, said first sealing section first upper projecting lip extension top surface in engagement with said bottom surface of said second sealing section recessed edge, and wherein said first sealing section first upper projecting lip side surface engages said second sealing section downward projecting lip first side surface, when said top and bottom joinable sections are joined.

7. A sealing assembly for mating an electrical device enclosure, as in claim 1, wherein said first sealing section second upper projecting lip extension includes first and second side surfaces and a top surface, said second side surface extending below said first side surface to an orthogonal edge surface, said first sealing section second upper projecting lip extension extending partially into said second sealing section channel, defining an opening therein.

8. A sealing assembly for mating an electrical device enclosure, as in claim 7, wherein said second sealing section channel includes first and second side surfaces and a top surface, said second side surface extending to an orthogonal edge surface.

9. A sealing assembly for mating an electrical device enclosure, as in claim 8, wherein said second upper projecting lip orthogonal edge surface and said second sealing section channel orthogonal edge surface are engaged when said top and bottom joinable sections are joined.

10. A sealing assembly for mating an electrical device enclosure, the enclosure having top and bottom joinable sections, the assembly comprising:
    a first sealing section disposed on said top joinable section, said first sealing section including first and second upper projecting lip extensions, the second upper projecting lip extension having a height less than the first upper projecting lip extension, the first and second upper projecting lip extensions of said first sealing section forming a channel therebetween,
        wherein said first sealing section second upper projecting lip extension includes first and second side surfaces and a top surface, said second side surface extending below said first side surface to an orthogonal edge surface;
    a second sealing section disposed on said bottom joinable section, said second sealing section comprising a downward projecting lip extension, said downward projecting lip extension engaged within said channel of said first sealing section, and offset from said first section upward projecting lip extension when said top and bottom joinable sections are joined,
        wherein said downward projecting lip extension further includes first and second side surfaces, and wherein said second sealing section further includes a recessed edge having a bottom surface orthogonal to said downward projecting lip extension first side surface, and
        wherein said first sealing section first upper projecting lip extension further includes a top surface and a side surface, said first sealing section first upper projecting lip extension top surface in engagement with said bottom surface of said second sealing section recessed edge, and wherein said first sealing section first upper projecting lip side surface engages said second sealing section downward projecting lip first side surface, when said top and bottom joinable sections are joined, said second sealing section further including a channel adjacent to said first downward projecting lip extension, and wherein said second sealing section channel further includes first and second side surfaces and a top surface, said second side surface extending to an orthogonal edge surface, and wherein said second upper projecting lip orthogonal edge surface and said second sealing section channel orthogonal edge surface are engaged when said top and bottom joinable sections are joined, and wherein said first sealing section second upper projecting lip extension extends partially into said second sealing section channel, forming an opening therein, when said top and bottom joinable sections are joined.

11. A sealing assembly for mating an electrical device enclosure, as in claim 10, wherein said opening in said second sealing section channel further includes a gasket therein.

12. A sealing assembly for mating an electrical device enclosure, as in claim 11, wherein said gasket is sized to compress when said top and bottom joinable sections are joined.

13. A sealing assembly for mating an electrical device enclosure, the enclosure having top and bottom joinable sections, the assembly comprising:

a first sealing section disposed on said top joinable section, said first sealing section including a plurality of upper projecting lips, said upper projecting lips decreasing in height;

a second sealing section disposed on said bottom joinable section, said second sealing section including a plurality of downward projecting lips, said downward projecting lips increasing in height, wherein said second sealing section plurality of downward projecting lips is offset from said first sealing section plurality of upper projecting lips, when said top and bottom joinable sections are joined;

and wherein said first sealing section plurality of upper projecting lips and said second sealing section plurality of offset downward projecting lips include a space therebetween, said space forming a channel therein.

14. A sealing assembly for mating an electrical device enclosure, as in claim 13, wherein said plurality of offset downward projecting lips of said second sealing section engage said plurality of channels of said first sealing section, and said plurality of upward projecting lips of said first sealing section engage said plurality of channels of said second sealing section when said top and bottom joinable sections are joined.

15. A sealing assembly for mating an electrical device enclosure, as in claim 14, wherein at least one of said plurality of channels of said first or second sealing sections contain a gasket therein.

16. A sealing assembly for mating an electrical device enclosure, as in claim 15, wherein said gasket is sized to compress when said top and bottom joinable sections are joined.

* * * * *